United States Patent [19]

Stals et al.

[11] Patent Number: 5,833,365
[45] Date of Patent: Nov. 10, 1998

[54] METHOD FOR LOCAL TEMPERATURE SENSING FOR USE IN PERFORMING HIGH RESOLUTION IN-SITU PARAMETER MEASUREMENTS

[75] Inventors: Lambert Stals, Diepenbeek; Luc De Schepper, Hasselt; Jean Roggen, Lummen; Ward De Ceuninck, Avelgem, all of Belgium

[73] Assignees: Interuniversitair Micro-Electronika Centrum vzw; Limburgs Universitair Centrum, both of Belgium

[21] Appl. No.: 620,250

[22] Filed: Mar. 22, 1996

[30] Foreign Application Priority Data

Mar. 24, 1995 [EP] European Pat. Off. .............. 95200747

[51] Int. Cl.⁶ .................................................. G01N 25/72
[52] U.S. Cl. ................................................ 374/5; 374/43
[58] Field of Search ....................... 374/1, 4, 5, 43, 374/45, 57, 181; 324/703; 364/571.03

[56] References Cited

U.S. PATENT DOCUMENTS

| | | | |
|---|---|---|---|
| 3,530,377 | 9/1970 | Tanzman | 324/703 |
| 4,210,024 | 7/1980 | Ishiwatari et al. | 374/1 |
| 4,775,838 | 10/1988 | Mizuta et al. | 324/703 |
| 5,032,727 | 7/1991 | Cox, Jr. et al. | 374/5 |
| 5,224,775 | 7/1993 | Reading et al. | 374/11 |

FOREIGN PATENT DOCUMENTS

| | | | |
|---|---|---|---|
| 0 049 754 A1 | 4/1982 | European Pat. Off. | G01R 19/32 |
| 0 382 217 A2 | 8/1990 | European Pat. Off. | G01R 17/08 |
| 0 395 149 A1 | 10/1990 | European Pat. Off. | G01R 31/30 |
| 0 523 729 A1 | 1/1993 | European Pat. Off. | G01R 31/28 |
| 32 12611 A1 | 10/1983 | Germany | G01R 19/32 |

*Primary Examiner*—G. Bradley Bennett
*Attorney, Agent, or Firm*—McDonnell Boehnen Hulbert & Berghoff

[57] ABSTRACT

An apparatus and method for measuring a parameter of a sample or component at a measurement temperature, wherein the parameter and the measurement temperature are measured at substantially the same time. A temperature coefficient of the sample or component is also established by using temperature fluctuations measured at or near the sample at the time at which the parameter is measured. The temperature coefficient is used to correct the measured parameter data and enhance its stability.

6 Claims, 7 Drawing Sheets

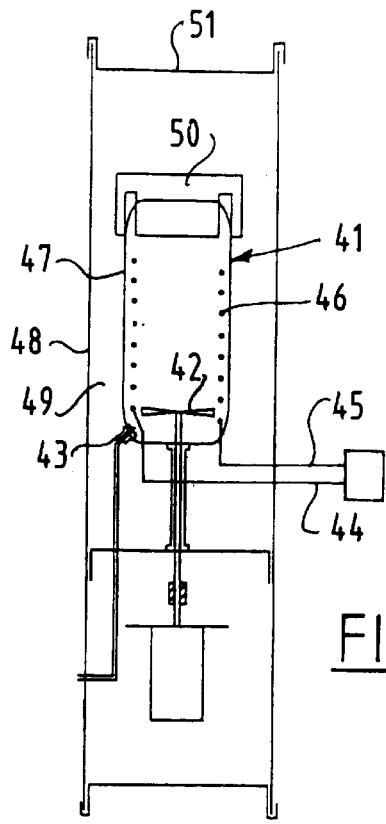
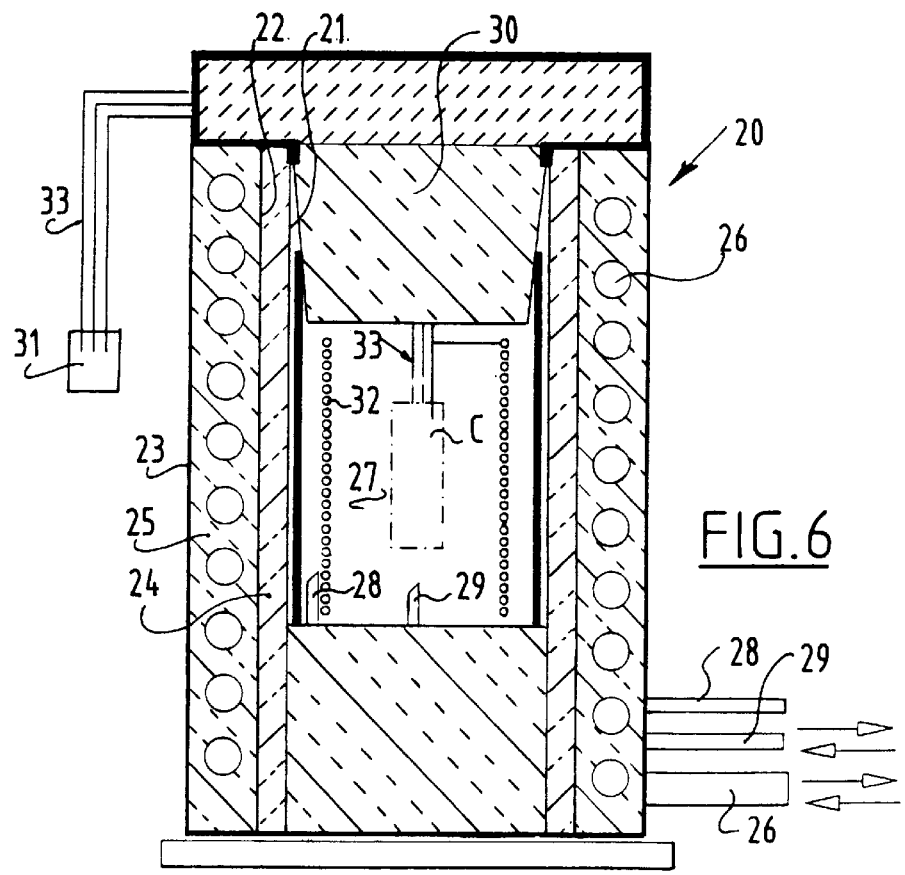

METHOD FOR LOCAL TEMPERATURE SENSING FOR USE IN PERFORMING HIGH RESOLUTION IN-SITU PARAMETER MEASUREMENTS

BACKGROUND OF THE INVENTION

The reliability of electronic components is of crucial importance in modern industry. There is an increasing demand for realistic predictions of the lifetimes of electronic components and of the variation of the components' parameter values over their lifetimes. The components of interest for such parameter value predictions include diodes, transistors, passive components such as metalization lines, wire bonds, resistors, capacitors, dielectrics, etc.

One method for predicting the value of a component's ageing parameter as a function of time is to place the component in an environment having an elevated temperature, perform a measurement of the parameter, and then repeat the cycle until sufficient measurements are made to permit a reliable prediction of the parameter value over time. However, because of the time required to perform this method it is particularly disadvantageous for systems wherein a small change of the parameter value occurs.

In European Patent Application EP-A-0395149, an in-situ component ageing technique is described, wherein it is possible to measure a component parameter value at an elevated temperature during a relatively short time period, typically on the order of 48 hours or less. In such a case, it is necessary that experimental errors in the collected data be minimized if extrapolation of the results to real operating conditions and future times are desired. In this technique, the oven in which the elevated temperature is achieved has a high temperature stability, e.g. on the order of ±0,01° C., or even as small as ±0.001° C.

Such a high degree of temperature stability is difficult to achieve and is sometimes accomplished by limiting the physical size of the oven, which generally permits better control of the temperature distribution within the oven. However, a disadvantage of limiting the physical size of the oven is that only one or a small number of components can be evaluated at the same time.

What is desired is an apparatus and method for obtaining high precision measurements of a component parameter which are corrected for temperature fluctuations occurring in an oven in which the measurements are made.

SUMMARY OF THE INVENTION

The present invention provides a method for measuring a property or parameter of a sample at a certain measurement temperature, wherein the property and the measurement temperature are determined at substantially the same point in time. In addition, a temperature coefficient of the sample is established based on temperature fluctuations measured at or near the sample at that point in time. The temperature coefficient is used to correct the measured property value and assist in evaluating the variation of the measured property over time.

According to a further aspect of the present invention, there is disclosed an oven or furnace in which such reliability tests and parameter measurements can be conducted.

Further details, advantages and features of the present invention will become clear upon reading the following description with reference to the annexed drawings.

BRIEF DESCRIPTION OF THE DRAWINGS

FIG. 6 is a sectional view of a first oven or furnace suitable for use in performing the method of the present invention.

FIG. 7 is a sectional view of a second oven or furnace suitable for use in performing the method of the present invention.

DETAILED DESCRIPTION OF THE INVENTION

Figure 1:
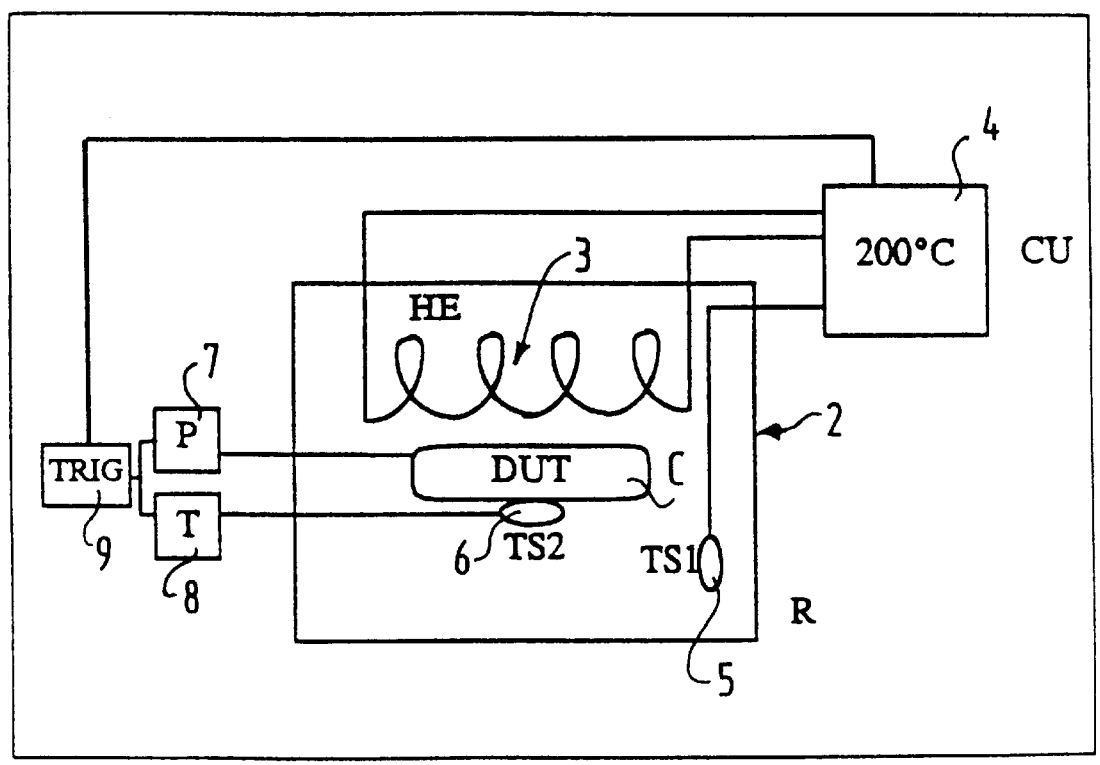
FIG. 1 is a block diagram of a preferred embodiment of an apparatus for implementing the local temperature sensing and high resolution measurement method of the present invention.

FIG. 1 is a block diagram of a preferred embodiment of an apparatus 1 for implementing the local temperature sensing and high resolution measurement method of the present invention. In apparatus 1 of the present invention, an electronic component C (labelled "DUT", device under test in the figure) is arranged in a recipient or oven 2 which is provided with heating means 3 (labelled "HE"). Heating means 3 are connected to a control unit 4 (labelled "CU") to which a first temperature sensor 5 (labelled "TS1") placed inside furnace 2 is also connected. Near the component C a second temperature sensor 6 (labelled "TS2") is arranged. Temperature sensor 6 is arranged so as to be in good thermal contact with component C. Component C is connected to a multimeter circuit 7 (labelled "P") for measuring the desired ageing parameter or property of the component. Second temperature sensor 6 is connected to a second multimeter circuit 8 (labelled "T") for acquisition of data regarding the temperature of the component. Both multimeter circuits 7 and 8 are connected to the same trigger circuit 9 (labelled "TRIG"), which is also connected to control unit 4. By triggering multimeter circuits 7 and 8 at the same time, a file with the information (P,T,t) is produced and stored, wherein t is the time of the measurement, T is the temperature measured by second temperature sensor 6, and P is the property or parameter of the component measured.

As will be described, the collected data (P,T,t) is subsequently processed to enhance the stability of the data set. This reduces the variance of the data contained in the data set. The processing causes the performance level (in terms of ability to accurately predict the value of the measured parameter over time) of the corrected data set to be better than, or at least comparable to that which can be obtained using a furnace with higher temperature precision (less variation of the temperature inside the oven). The data processing method of the present invention will now be described.

The temperature dependence of an electrical parameter P, i.e., P(T) can be expressed as:

$$P(T)=P(T^*) \cdot (1+\alpha \Delta T) \qquad [1]$$

where $\alpha$ is the temperature coefficient of the component with respect to the measured parameter, $T^*$ is the desired temperature at which the parameter value is to be determined, T is the temperature measured by sensor 6 (the temperature of, or in close proximity to the component placed in the oven), and $\Delta T$ is the difference between the temperatures T and $T^*$ (i.e., $T-T^*$). Equation [1] describes a linear relationship (expressed in terms of $\alpha$) between the parameter value at one temperature and its value at a second temperature. Note that a more general relationship between $P(T^*)$ and $P(T)$ can also be used when practicing the present invention, with any changes to the steps to be described being within the capabilities of one skilled in the art.

If a set of data files $(P_i, T_i)$ is available, where i=1..N, then assuming $\alpha$ is known, a corrected data set can be calculated using the following relationship:

$$P^c(T^*)=P(T^*) \text{ (from equation 1)}=P(T)/(1+\alpha(T-T^*))\sim P(T) \cdot (1-\alpha(T-T^*)) \qquad [2]$$

Equation 2 is applicable under the assumption that $\alpha(T-T^*) \ll 1$, which is the case for the systems and measurement conditions typically encountered. Note that this assumption is useful for facilitating the mathematical formulation of the method and is not required for practice of the method. $P^c(T^*)$ is the calculated value of the parameter P at the desired temperature $T^*$, referred to as $P(T^*)$ in equation 1.

The temperature coefficient a can be determined from the (P,T) data sets by using a minimalization procedure. A number of mathematical methods are suitable for this purpose.

When using the method of Cook (B. C. Cook, Physical Review, No. 106, page 300, 1957), wherein a smoothness parameter S is defined in relation to the calculated data, the optimum value of a for maximum smoothness is determined as follows:

$$\alpha = \frac{\Sigma(P_{i+1} - P_i) \cdot (P_{i+1}\Delta T_{i+1} - P_i\Delta T_i)}{\Sigma (P_{i+1}\Delta T_{i+1} - P_i\Delta T_i)^2}$$

$$S = \Sigma (P^c_{i+1} - P^c_i)^2$$

In the equation for $\alpha$, $\Delta T_i$ is the ith value for the temperature difference $(T-T^*)$ obtained from the $(P_i,T_i)$ data file. Note that other more complex smoothness parameters can of course be used for processing the data. By virtue of the above equations, it is shown that the temperature coefficient ($\alpha$) can be determined using the measured (P,T) data. It is significant to note that the presence of temperature fluctuations, $\Delta T$, are used to determine the quantity $\alpha$. Once the temperature coefficient is determined, it is inserted into equation [2] to determine the corrected value of the component parameter. The corrected value corresponds to the parameter value which would be obtained by performing the parameter measurement in an oven having an enhanced temperature stability compared to the oven in which the measurements were actually performed.

The minimalization procedure can be performed on sections of the (P,T) data set, and not on the entire data set simultaneously. In this way a temperature coefficient ($\alpha$) curve as function of ageing time can be obtained. This formulation of the quantity a can be introduced in the temperature stability enhancement routine described by the previous equations by making $\alpha$ a function of time. This leads to a more complex mathematical formulation than the one described above for determining $P^c(T^*)$. This technique will be referred to as the $\Delta$-$\alpha$ deconvolution technique, since it is possible to discriminate between drift of the component parameter values $\Delta P$, and temperature coefficient ($\alpha$) characterization during ageing as a result of a single isothermal ageing experiment. Apart from the possibility that changes in the process occur during ageing, the above technique is also useful for theoretical studies and verification purposes. Note that the temperature coefficient ($\alpha$) of a temperature sensor itself may be calculated and used to correct the temperature measurements made within an oven or furnace used to measure the parameter data.

It has been shown by the inventors of the present invention that the above described concept further enhances the effective temperature stability of the measured P data. This means that the processed (P,T) data has a variance in the parameter values which corresponds to that which would be obtained from making the parameter measurements in a "high precision" oven having a higher degree of temperature stability. Precision furnace systems make use of multimeters with a temperature read-in resolution of approximately ±0.0002° C. When using the above described parameter data correction concept it becomes possible to correct the data to have an effective temperature stability that equals this amount. However, in accordance with the present invention, it is possible to achieve the noted performance level with a furnace system that has a temperature stability of in the range of only ±0.5° C. As a result, the inventive concept can reduce costs and make parameter ageing determinations less sensitive to environmental fluctuations of temperature and other parameters.

A further beneficial feature of the described invention is the ability to measure the parameters of a number of components at the same time in a medium precision furnace with high capacity, such as a classic box-oven. Due to the high volume capacity of such a system when used with the data correction method described, it is possible to achieve a high level of temperature stability and/or uniformity for a number of components simultaneously, in a manner comparable to that of a high precision furnace. In such an embodiment of the present invention, every component will be equipped with an individual temperature sensor. Many measurements can be conducted at the same time with a high degree of accuracy and stability, even in the case where the local temperature in the oven varies.

Figure 2:
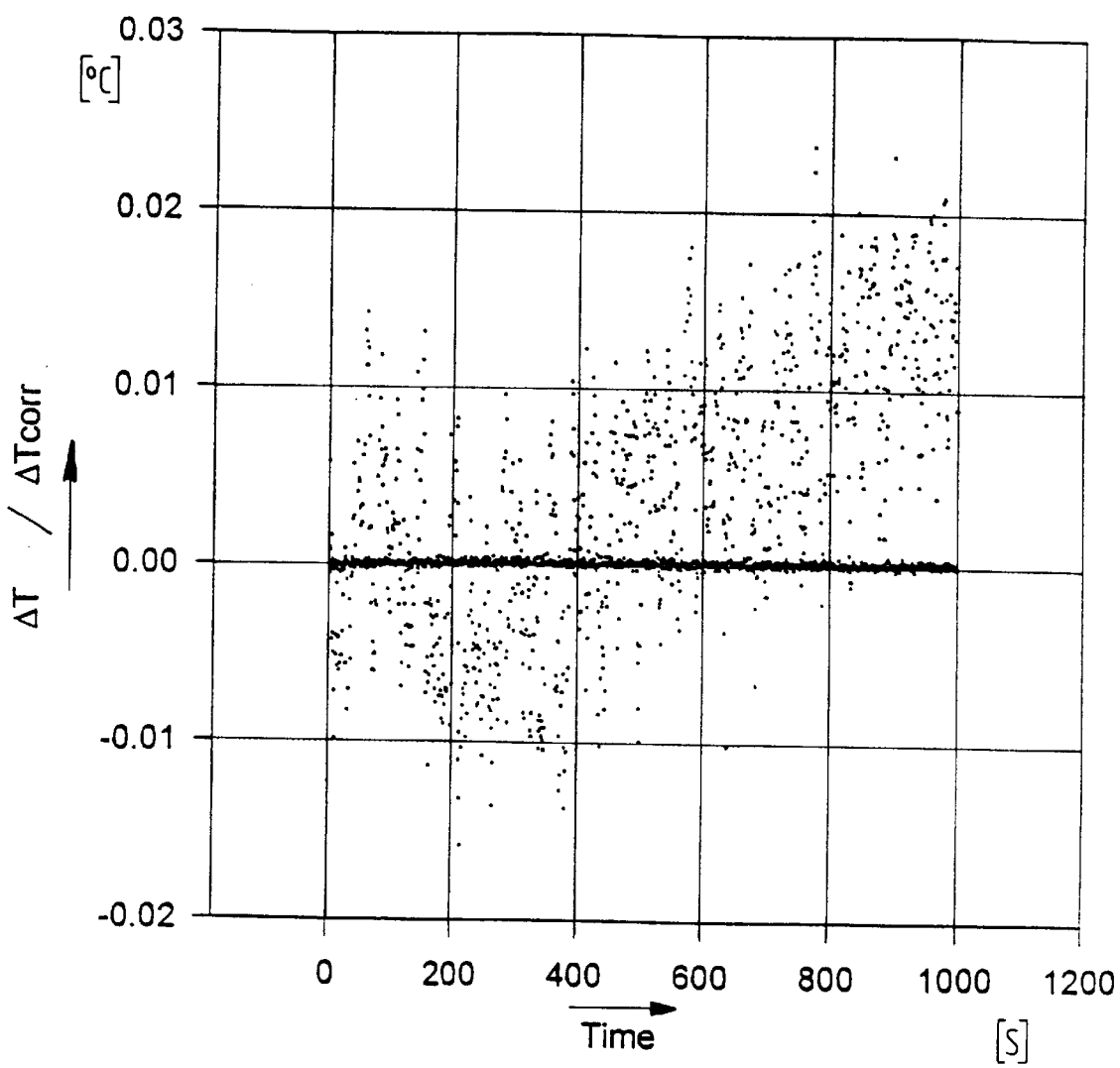
FIG. 2 is a data plot showing the temperature difference within the apparatus and the effective corrected temperature difference for parameter measurements made using the apparatus of FIG. 1.
Figure 3:
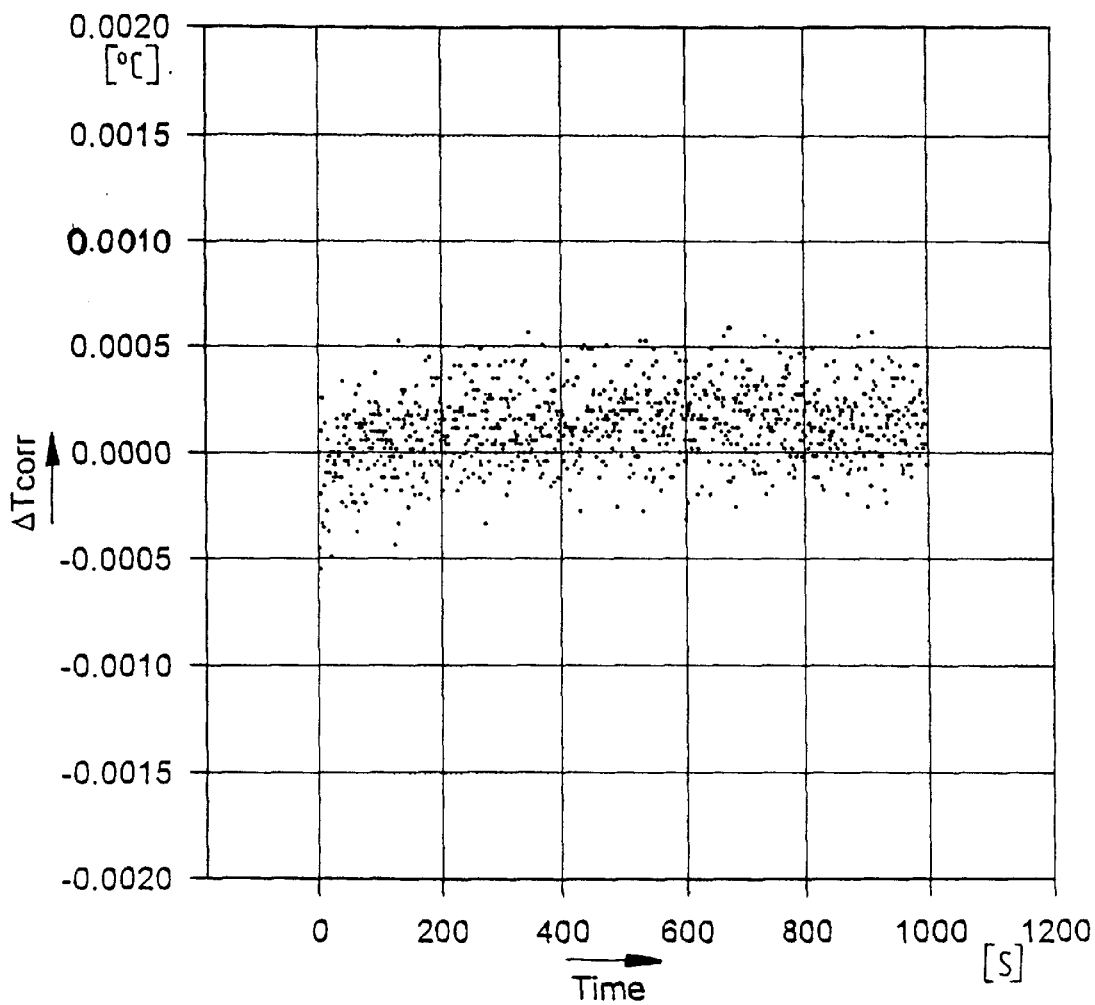
FIG. 3 is a more detailed representation of the corrected temperature data shown in FIG. 2.

FIG. 2 is a data plot showing the temperature difference $\Delta T$ within the apparatus and the effective corrected temperature difference $\Delta T_{corr}$ (expressed in °C) as a function of measurement time (expressed in seconds) for parameter measurements obtained using the apparatus of FIG. 1. The scattered points in the figure ($\Delta T$) represent the temperature fluctuations within the apparatus as measured at the active zone near a component. As indicated by the spread of the data, a temperature stability of approximately ±0.05° C. is present. The points lying on a flat line (corresponding to a value of 0.00° C.) result from using the previously described algorithm to correct the parameter measurements. These points ($\Delta T_{corr}$) represent the effective temperature fluctuations corresponding to the corrected parameter data. In FIG. 3 (and FIG. 2) it is shown that the $\Delta T_{corr}$ data points have an effective temperature stability of approximately ±0.0005° C. This value is an improvement by a factor of 100 over the temperature fluctuations actually present in the oven, as represented by the scattered data of FIG. 2. For this example, this means that by using the apparatus and method of the present invention, parameter measurements can be obtained which have a temperature stability on the order of 100 times better than that present in the oven in which the measurements are made.

The measurements plotted in FIGS. 2 and 3 were obtained from a box-oil-bath type furnace at a temperature of 75° C. A Pt 100 resistor was used as the temperature sensor.

Figure 4:
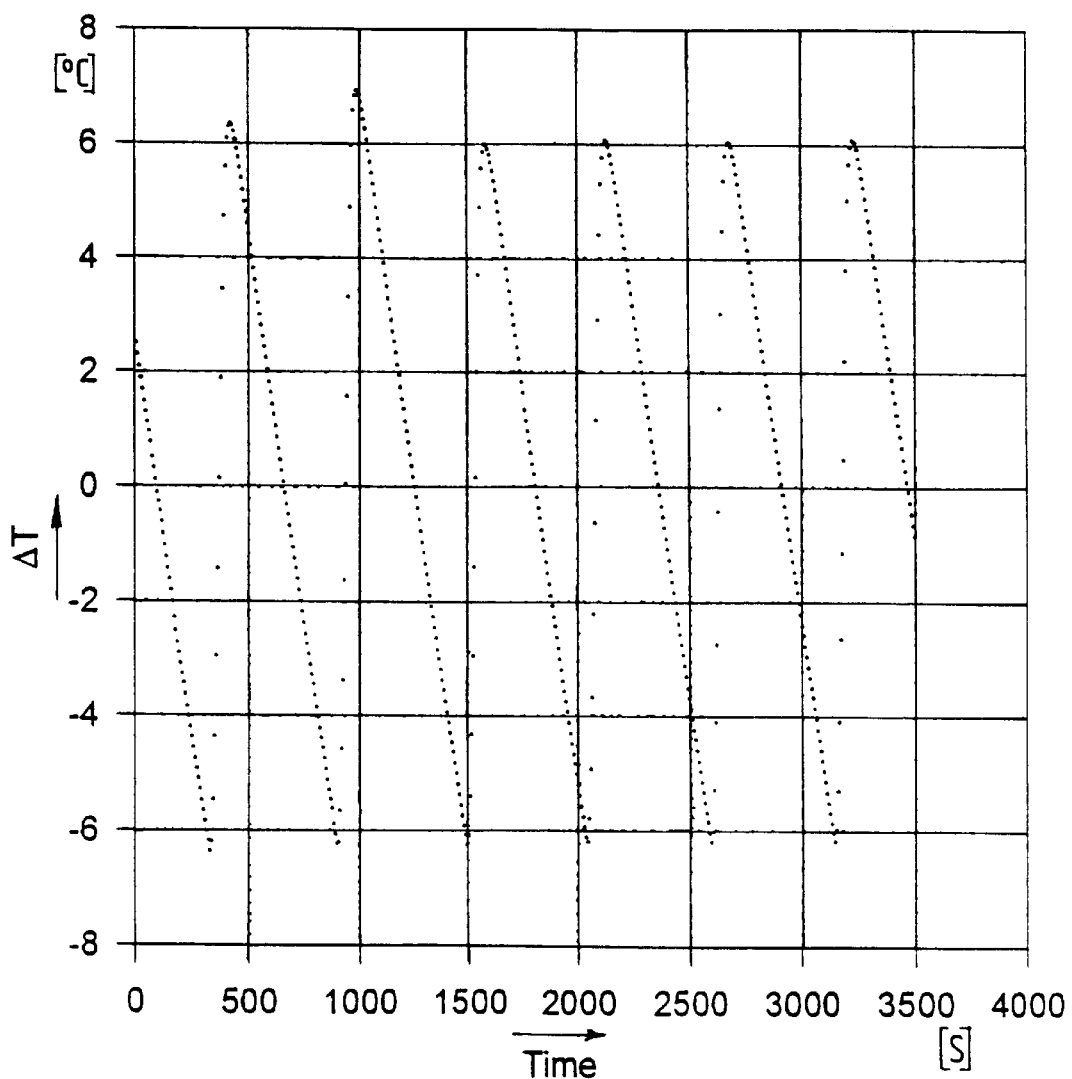
FIG. 4 is a data plot showing the temperature fluctuations ($\Delta T$) as a function of time within a box-oil-bath furnace when operated at a temperature of T=150° C.
Figure 5:
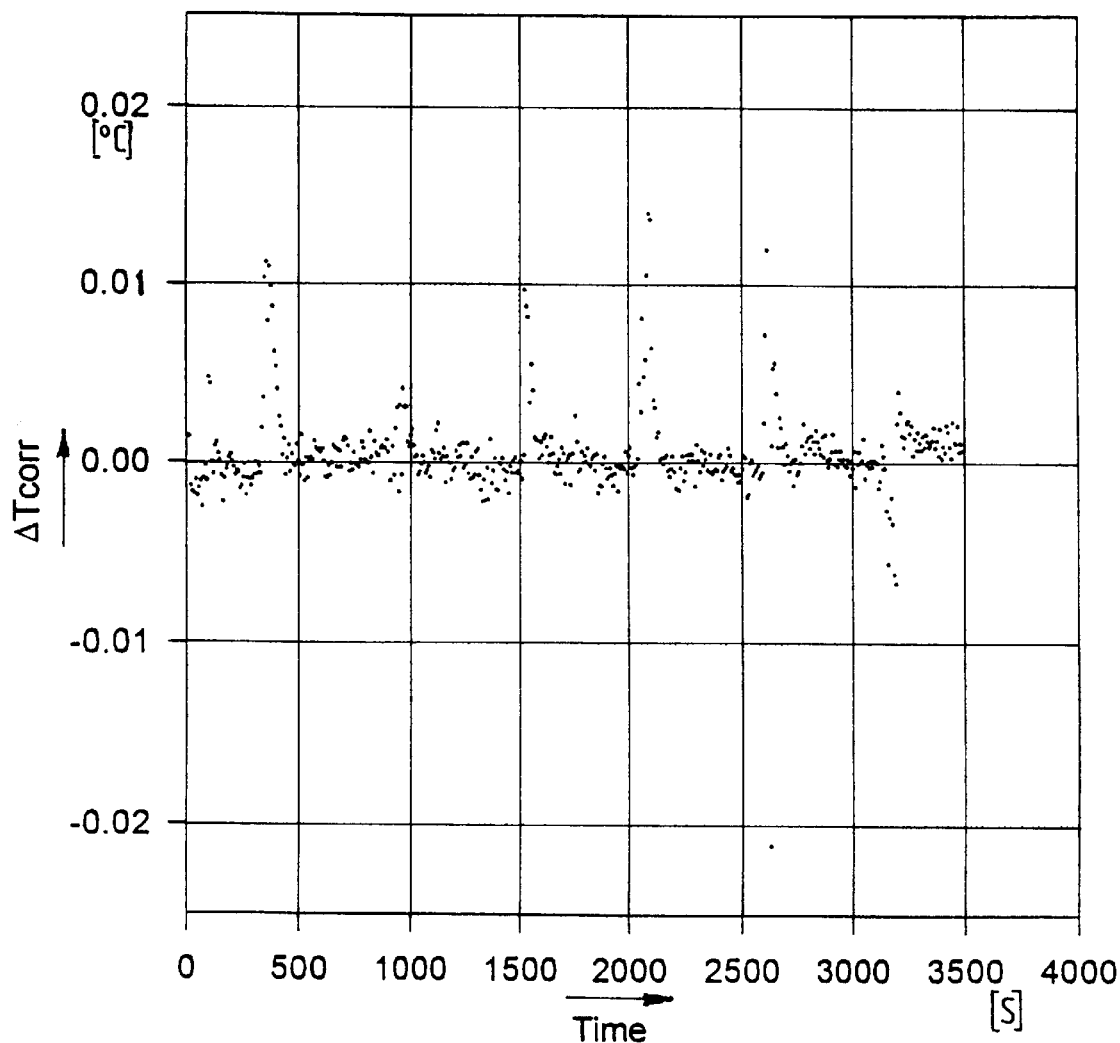
FIG. 5 is a data plot of the effective temperature variation for the data shown in FIG. 4 after correction in accordance with the method of the present invention.

An on/of temperature control was used in the box-oil-bath furnace. The temperature stability of the furnace at T=150° C. is on the order of +6° C., and temperature increases at a rate as high as 20° C./min can occur. After applying the above described parameter data correction concept, an effective temperature stability as high as ±0.01° C. can be obtained. FIG. 4 is a data plot showing the temperature fluctuations (ΔT) as a function of time within the described box-oil-bath furnace when operated at a temperature of T=150° C. The effective corrected temperature variance, $\Delta T_{corr}$ corresponding to the corrected parameter data is shown in FIG. 5. It is noted that the measurements which produced the data shown in FIGS. 4 and 5 were conducted in a kettle used for preparing french fries. The spikes in the data plotted in FIG. 5 are due to the switch-on characteristics of the kettle and can be removed by using a PID control. Presumably, removal of the data spikes would result in a temperature stability of approximately ±0.002° C., thereby providing an improvement factor of 3000 over the scattered data shown in FIG. 4.

A gasflow oven 20 (shown in FIG. 6) which can be used to implement the method of the present invention consists of a double insulated cylindrical metal recipient which is hermetically closed. The oven consists of a cylindrical inner wall 21, an intermediate wall 22, and an outer wall 23 of metal. Between the inner wall 21 and the intermediate wall 22 a layer of insulating compacted mineral powder, e.g. aluminum oxide is disposed. It is noted that other insulation material that is able to withstand the applied range of temperatures can also be used. Between intermediate wall 22 and outer wall 23 a further insulating layer is disposed, which allows for arranging a cooling coil 26 therein. The atmosphere in the interior 27 of the oven is gaseous for which purpose a gas inlet 28 and a gas outlet 29 are disposed. The flow rate pressure and composition of the gaseous atmosphere can be varied. The schematically designated component C is provided with connection line(s) 33 which extend through an insulating cap 30 to a control unit 31 for temperature sensing and heating power input. Temperature measurement is performed using platinum resistors (not shown). The temperature regulation is performed by a PID control (not shown), although other control methods and apparatus may be employed. A heating element 32 is wound and fits to the inner wall of the furnace. The spacing between the windings of the heating coil is made small, e.g. about 1 mm, to ensure good thermal coupling between heating element 32 and the surrounding gas atmosphere. A spacing of a few millimeters is provided between heating element 32 and inner wall 21. Heating coil 32 is preferably made of thermocoax type heating wire. The low thermal mass of the heating element and the direct coupling to the surrounding gas provides a fast response to input power changes, which is desirable for fast dynamic temperature control. The austenitic steel sheathing of the thermocoax wire is inert against oxygen and water vapor up to 600° C. Inner wall 21 is preferably fully reflective to enhance thermal insulation. Gas inlet 28 is placed between inner wall 21 and heating coil 32. The gas flow can be controlled externally. Gas outlet 29 is placed inside the space enclosed by heating coil 32. In the example shown, the usable volume of the internal space of the oven is approximately 0.25 liters. Other oven dimensions can be used as long as the design permits a smooth gas flow to achieve equal temperature distribution. In practice the height to width ratio of the oven is chosen to be between 2:1 and 1:1. The temperature can range between room temperature and approximately 500° C. Using the apparatus shown, a temperature stability of approximately ±0.001° C. at a working temperature of 200° C. can be obtained. To allow for lower temperatures than room temperature, the cooling system is used. The cooling temperature needs to be roughly stabilized and the final temperature of the recipient can be controlled through use of the heating element inside. The usable temperature range of this furnace is from −150° C. where liquid nitrogen can be used as medium, to +300° C. or more.

The above described gas flow furnace of FIG. 6 achieves a high level of temperature stability. The described temperature correction method can be used to enhance the effective temperature stability, up to the limit of the data acquisition capability. It is noted that by using the parameter data correction method described, the design of the furnace becomes less critical.

A tube-oil-bath furnace of the type shown in FIG. 7 can also be used to practice the present invention. The furnace of FIG. 7 makes use of a light thermal mass circulating fluid in a metal recipient or a lightweight oven 41 which is thermally insulated from external influence. In a preferred embodiment, silicon oil is used as fluid, although other inert and electrical insulating fluids can be used. The bottom of the inner oven 41 is provided with a propeller 42 for circulation of fluid, a temperature sensor 43, and connections 44 and 45 for a heating element 46. Between inner wall 47 and outer wall 48 insulating foam 49 is disposed. The component whose parameter is to be measured (not shown) is introduced into the oven by removing cover 50, which is preferably made of teflon, and upper cover 51. With the tube oil-bath furnace of FIG. 7, a temperature increase rate of 30° C./min is possible. The cooling down rate is approximately 1° C. per minute. For temperature control a PID control is preferably used. The usable volume of this furnace is approximately 380 cubic mm, while the maximum diameter is approximately 56 mm and the depth approximately 120 mm. The temperature can vary between room temperature and 250° C. The temperature stability is better than ±0.005° C. at T=200° C. The dissipated power is less than 300 watts at 200° C., and 700 watts during fast heating.

The parameter data correction method described above can be used with this type of oven to further enhance the temperature stability up to the limit of the data acquisition resolution method.

Figure 8:
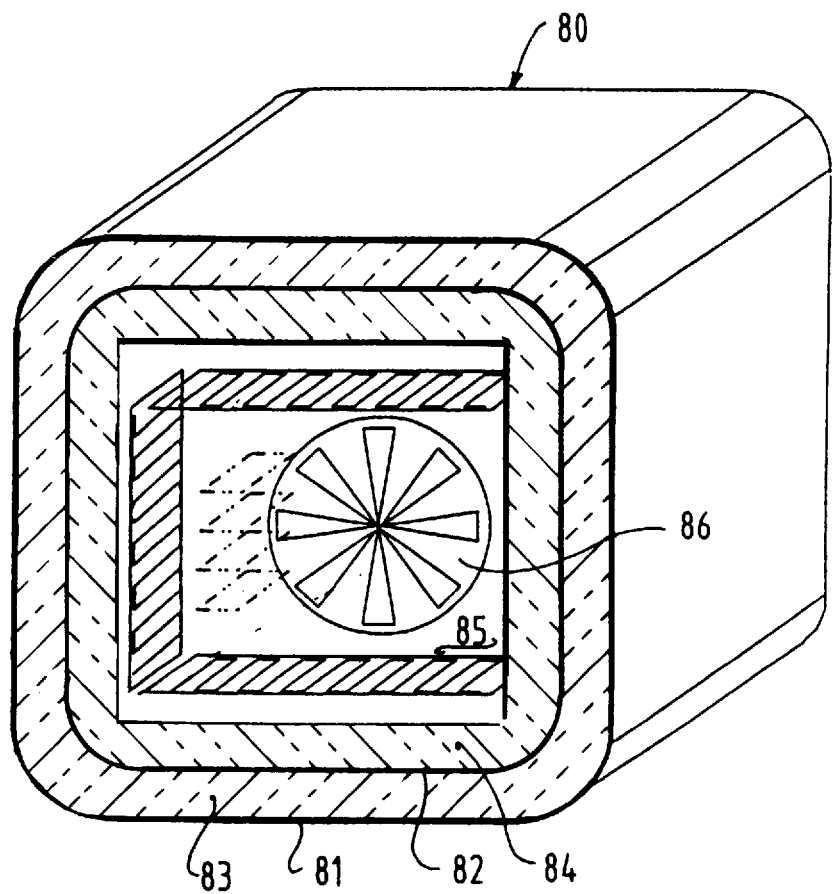
FIG. 8 is a sectional view of a third oven or furnace suitable for use in performing the method of the present invention.

A box-oven 80 of the type shown in FIG. 8 has a large volume and provides for the possibility of measuring the parameters of a number of components simultaneously. Oven 80 consists of an outer wall 81 and an inner wall 82 between which a first insulating layer 83 is disposed. Between the inner wall and the outer wall a further layer 84 of insulating material is arranged. The dimensions of the inner space 85 of oven 80 are approximately cubic to optimize the ratio between oven surface and usable volume. The volume of inner space 85 is approximately 300 liters. Although other insulating material can be employed, in a preferred embodiment the insulating layer consists of a 10 cm thick layer of foam glass which is mounted between the inner and outer walls. The surface of inner wall 82 is heat reflective to reduce heat loss. Oven 80 is provided with a ventilation system 86 to provide continuous gas flow inside the oven volume. Heating of the inner space is provided by four or more electrical heating elements made of thermocoax wire wound to rectangular flat coils. The heating power reaches up to 700 watts (10A at 70V) with a steady-state heating power of about 500 watts at 200° C. The heating element(s) are mounted inside the oven parallel to the inner walls. A distance of a few centimeters between the heating element(s) and inner wall 82 is arranged to permit free air flow. This placement of the heating element(s) yields approximately uniform heating power distribution. The temperature gradient inside the oven is minimized and heat transport in improved by the forced air flow. The oven temperature is measured with a platinum resistor (not shown) located near the center of the oven volume. Temperature data are processed with a digital PID control, preferably having 16 bit resolution or higher. Other temperature controls can also be used.

The usable temperature range of the box type furnace of FIG. 8 extends from room temperature to 250° C., while wider temperature ranges are also feasible. With this type of oven a temperature stability of approximately ±0.05° C. is obtained with an overall temperature gradient of 0.2° C. As is known, thermocoax wire consists of Ni/Fe core heating wire coaxial with an austenitic steel sheath and electrically insulated by compacted mineral powder. In air, the safe working temperature can reach 600° C.

The box furnace shown in FIG. 8 provides a medium level of temperature stability. This furnace, however, provides the advantage of being able to be used to measure parameter values for a large number of components simultaneously owing to its inner volume.

When the above described parameter data correction is used, the effective temperature stability can be enhanced to a performance level of approximately ±0.001° C., while approximately 100 components can be present in the oven.

Figure 9:
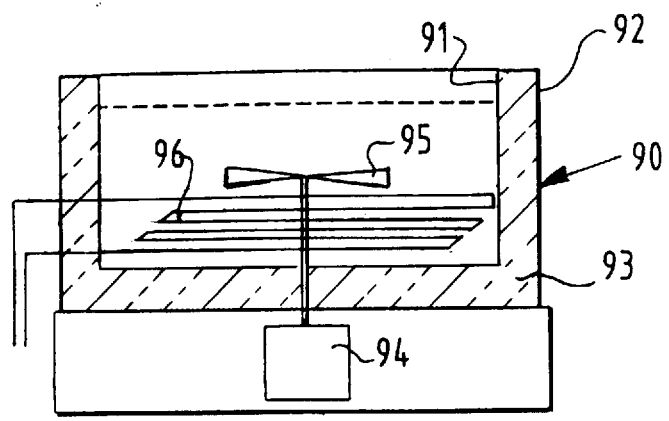
FIG. 9 is a schematic view of a fourth oven or furnace suitable for use in performing the method of the present invention.

A box-type-oil bath furnace 90 of the type shown in FIG. 9 also has a large inner volume, on the order of more then 4 liters. This allows the measurement of a large number of components at the same time. Oven 90 consists of inner wall 91 and an outer wall 92 between which insulating material 93 (e.g. foam glass) is introduced. Other insulating materials can also be used. Oven 90 is provided with a propeller 95 driven by a motor 94 to provide continuous flow of the fluid inside the oven. In the embodiment of FIG. 9, heating is provided with metal shielded electrical heating elements 96 located at the bottom of the oven volume. The heating power reaches up to 2000 watts. Heating power is controlled by modulation of power pulse length. A distance of a few centimeters is arranged between heating elements 96 and the oven bottom to enhance fluid circulation. Propeller 95 improves fluid flow and heat transport. The oven temperature is measured with a platinum resistor (not shown) located near the center of the oven volume. Temperature data are processed with a PID control. Other control types can also be employed. The temperature range of the box-oil-bath type furnace of FIG. 9 is between room temperature and 250° C., depending among other things on the type of the fluid used. A temperature stability of approximately ±0.1° C. is obtained with a temperature gradient of ±0.1° C.

The furnace of FIG. 9 achieves a medium level of temperature stability. The temperature uniformity is, however good and comparable with a tube-oil-bath system, such as that of the type described previously. The previously described parameter data correction method can be used to enhance the temperature stability up to a level fully comparable to the other types of ovens. A temperature stability of approximately ±0.001° C. can be achieved with a high number (100 or more) of components being measured simultaneously.

The terms and expressions which have been employed herein are used as terms of description and not of limitation, and there is no intention in the use of such terms and expressions of excluding equivalents of the features shown and described, or portions thereof, it being recognized that various modifications are possible within the scope of the invention claimed.

We claim:

1. A method for determining a set of corrected aging parameters of a component, the method comprising the steps of:

measuring a first value of the parameter and at substantially the same time measuring a first value of the temperature;

measuring a second value of the parameter and at substantially the same time measuring a second value of the temperature;

determining a relationship between the parameter of the component and temperature wherein the determination is based upon at least the measured first and second value of the component parameter and the measured first and second value of the temperature;

determining corrected values of the parameter based on the determined relationship.

2. A method as in claim 1 wherein said corrected values are used to evaluate the variation of said aging parameter over time.

3. The method of claim 1, wherein the relationship includes a temperature coefficient and has a substantially linear dependence on temperature.

4. The method of claim 3, wherein the temperature coefficient is determined by using a minimalization procedure.

5. The method of claim 4, wherein the minimalization procedure uses a smoothness parameter.

6. The method of claim 3, wherein a minimalization procedure is performed on a plurality of parts of a data set obtained from the measurements of the sample or component parameter and the measurement temperature.

* * * * *